US006747480B1

(12) United States Patent
Kaptanoglu et al.

(10) Patent No.: US 6,747,480 B1
(45) Date of Patent: Jun. 8, 2004

(54) PROGRAMMABLE LOGIC DEVICES WITH BIDIRECTIONAL CASCADES

(75) Inventors: Sinan Kaptanoglu, Belmont, CA (US); Michael D. Hutton, Mountain View, CA (US); James Schleicher, Santa Clara, CA (US)

(73) Assignee: Altera Corporation, San Jose, CA (US)

(*) Notice: Subject to any disclaimer, the term of this patent is extended or adjusted under 35 U.S.C. 154(b) by 45 days.

(21) Appl. No.: 10/195,209

(22) Filed: Jul. 12, 2002

(51) Int. Cl.[7] .......................................... H03K 19/177
(52) U.S. Cl. .......................................... 326/41; 326/47
(58) Field of Search ............................... 326/41, 37–40, 326/46–47, 101

(56) References Cited

U.S. PATENT DOCUMENTS

| | | | |
|---|---|---|---|
| 4,789,951 A | 12/1988 | Birkner et al. ............... 364/716 |
| 4,871,930 A | 10/1989 | Wong et al. ................. 307/465 |
| 4,903,223 A | 2/1990 | Norman et al. ............. 364/716 |
| 4,912,345 A | 3/1990 | Steele et al. ................ 307/465 |
| 4,983,959 A | 1/1991 | Breuninger ............ 340/825.83 |
| 5,027,315 A | 6/1991 | Agrawal et al. ............ 364/900 |
| 5,168,177 A | 12/1992 | Shankar et al. ............. 307/465 |
| 5,191,243 A | 3/1993 | Shen et al. .................. 307/465 |
| 5,231,312 A | 7/1993 | Gongwer et al. ........... 307/465 |
| 5,350,954 A | 9/1994 | Patel ........................... 307/465 |
| 5,689,195 A | 11/1997 | Cliff et al. ..................... 326/41 |
| 5,796,269 A | 8/1998 | New ............................. 326/40 |
| 5,821,774 A | 10/1998 | Veytsman et al. ............ 326/39 |
| 5,828,229 A | 10/1998 | Cliff et al. ..................... 326/40 |
| 5,861,760 A | 1/1999 | Pedersen et al. .............. 326/39 |
| 6,020,759 A | 2/2000 | Heile ............................. 326/40 |
| 6,069,490 A | 5/2000 | Ochotta et al. ............... 326/41 |
| 6,091,263 A | 7/2000 | New et al. .................... 326/40 |
| 6,191,611 B1 * | 2/2001 | Altaf ............................. 329/39 |
| 6,215,326 B1 | 4/2001 | Jefferson et al. .............. 326/41 |
| 6,294,926 B1 * | 9/2001 | Cline ............................. 326/39 |
| 6,323,682 B1 * | 11/2001 | Bauer et al. ................... 326/41 |
| 6,384,627 B1 * | 5/2002 | Fross et al. .................... 326/39 |
| 6,407,576 B1 | 6/2002 | Ngai et al. ..................... 326/41 |
| 6,505,337 B1 * | 1/2003 | Wittig et al. .................. 716/17 |

OTHER PUBLICATIONS

"XC4000XLA/XV Field Programmable Gate Arrays," Production Specification, DS015 (v1.3) Oct. 18, 1999.
"XC4000E and XC4000X Series Field Programmable Gate Arrays," Production Specification, May 14, 1999 (v1.6).
Jason (Jingsheng) Cong et al., "Boolean Matching for LUT–Based Logic Blocks With Applications to Architecture Evaluation and Technology Mapping," *IEEE Transactions on Computer–Aided Design of Interated Circuits and Systems*, vol. 20, No. 9, pp. 1077–1090 (Sep. 2001).
Kevin Chung et al., "TEMPT: Technology Mapping for the Exploration of FPGA Architectures with Hard–Wired Connections," Department of Electrical Engineering, University of Toronto, Canada, FPGA '92 #21–#26.

* cited by examiner

*Primary Examiner*—James H Cho
(74) *Attorney, Agent, or Firm*—Fish & Neave; Robert R. Jackson (57) ABSTRACT

A programmable logic integrated circuit device has a plurality of regions of programmable logic disposed on the device in a plurality of intersecting rows and columns of such regions. The regions of logic may include logic subregions that each have a look-up table. Interconnection resources (e.g., inter-region and intra-region interconnection conductors, signal buffers and drivers, programmable connectors, etc.) are provided on the device for making programmable interconnections between the look-up tables. Programmable bidirectional cascade circuitry that is distinct from the interconnections may be used to make connections directly from the output of one look-up table to another without using the interconnection resources. The programmable cascade circuitry may be programmed so that multiple look-up tables are interconnected to form sequential cascade chains or cascade trees.

16 Claims, 9 Drawing Sheets

PROGRAMMABLE LOGIC DEVICES WITH BIDIRECT IONAL CASCADES

BACKGROUND OF THE INVENTION

This application relates to programmable logic array integrated circuit devices ("programmable logic devices"), and more particularly, to bidirectional cascade arrangements for interconnecting look-up table logic in programmable logic devices.

Programmable logic devices are integrated circuits that may be programmed by a user to perform various logic functions. Programmable logic devices typically include many regions of programmable logic. Inter-region or global interconnection conductors and circuitry may be used to convey signals between the logic regions. Logic regions may also include more local or dedicated intra-region interconnection resources that are used to convey signals between smaller portions or subregions of the logic regions.

The logic subregions may be based on look-up table logic. For example, the logic subregions may each include a four-input look-up table. An k-input look-up table has $2^k$ individually-programmable and individually-addressable binary cells. A look-up table may therefore be programmed to perform any desired logic function on its inputs.

Although a logic designer might sometimes wish that larger look-up tables were available (e.g., to rapidly perform functions involving 10 logic inputs), providing such large look-up tables just for this possibility is generally not practical. Large look-up tables consume large fractions of the real-estate available on a programmable logic device die, and tend to operate more slowly than smaller look-up tables. Trade-offs between performance and flexibility tend to favor programmable logic devices that have more modestly-sized look-up tables such as four-input look-up tables.

Special connections known as cascade connections may be provided that allow a chain of logic subregions to be concatenated together when needed. With this type of arrangement, a number of the look-up tables in a programmable logic device can be combined when necessary to provide some of the functionality of a much larger look-up table. (See, for example, Cliff et al. U.S. Pat. No. 5,258,668 and Ngai et al. U.S. patent application Ser. No. 09/516,921, filed Mar. 2, 2000, which are hereby incorporated by reference herein in their entireties.)

It is an object of the present invention to provide improved cascade connection arrangements for combining the resources of look-up tables in logic subregions when the capabilities of larger look-up tables are needed to implement a particular logic function.

SUMMARY OF THE INVENTION

This and other objects of the invention are accomplished in accordance with the principles of the invention by providing a programmable logic device with bidirectional cascade connection circuitry. The cascade circuitry on the device may be used to directly connect the output of one look-up table to the input of an adjacent or nearby look-up table. The cascade circuitry is bidirectional, because it may be used to route cascade signals in either of two opposite directions along a line of logic subregions.

The cascade circuitry may be programmed to form either a chain of look-up tables or a tree of look-up tables depending on the type of logic function that needs to be implemented by the device. The bidirectionality of the cascade connections therefore allows more logic functions to be implemented from a given set of look-up tables than could be implemented if only a unidirectional cascade chain configuration were available. Because tree-type cascade configurations can involve fewer look-up table delays than comparably-sized chains, the performance of a given logic function can sometimes be enhanced by using the bidirectional cascade connections to form a tree from the look-up tables rather than a chain.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
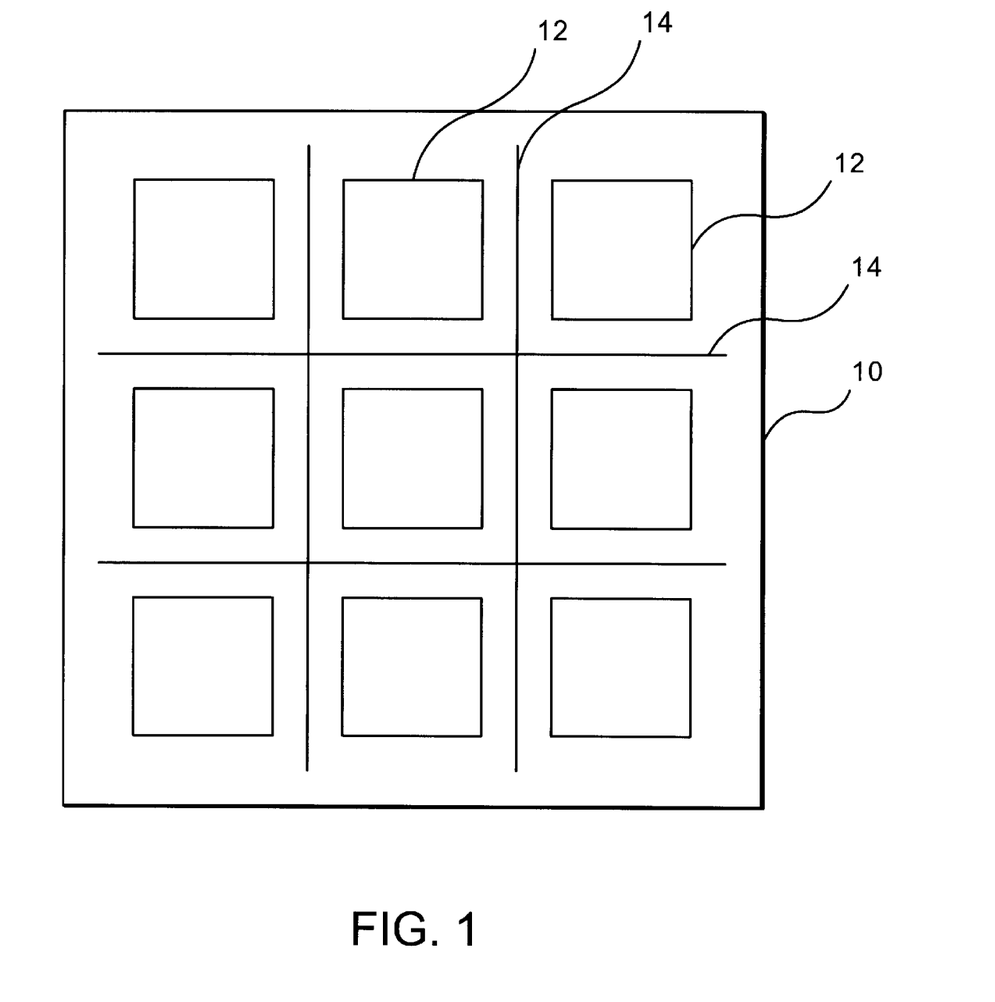
FIG. 1 is a simplified block diagram of an illustrative programmable logic device that can be constructed in accordance with the invention.

An illustrative programmable logic device 10, which can be constructed in accordance with this invention, is shown in FIG. 1. Device 10 may have a number of rows and columns of regions 12 of programmable logic. Regions 12 may be disposed on device 10 in a two-dimensional array of, for example, 5–300 rows and 5–300 columns of regions 12 or any other suitably-sized array.

The logic in regions 12 may be interconnected using interconnection resources such as vertical and horizontal conductors 14. Such conductors may, for example, include relatively large inter-region conductors that extend past all or some of the logic regions 12 in a row or column. There may be any suitable number of conductors 14. For example, there may be about 10–30 conductors 14 in each row and each column of regions 12. Programmable logic may be used to selectively connect all or subset of the conductors 14 in each row or column to the associated logic regions 12 in that column. If desired, programmable logic may also be used to directly interconnect the vertical and horizontal conductors 14. The conductors 14 may be continuous or segmented and, if segmented, may be programmably connected to serve as continuous conductors.

Input-output circuitry may be used to interconnect the logic of device 10 to external components (e.g., through I/O pads). Additional circuitry may also be used such as circuitry for programming and testing device 10. To avoid overcomplicating the drawing, details of the programmable logic interconnections, input-output circuitry, and programming and testing circuitry of device 10 are not shown in FIG. 1. Moreover, the arrangement of FIG. 1 is merely illustrative. Any suitable programmable logic device architecture may be used for device 10 if desired.

Programmable logic device 10 may be shipped to a customer in a substantially unprogrammed condition. The customer may use equipment (referred to as a device "programmer") to program or configure the device 10 so that device 10 performs a desired custom logic function. Sometimes two or more conductors must be selectively connected to a third conductor. This type of function may be performed using programmable logic connectors ("PLCs"). An example of a PLC is a programmable multiplexer. Programmable logic connectors are each typically controlled by programmable function control elements ("FCEs"). A programmable function control element may, for example, be based on a programmable cell.

The programmable logic connectors and function control elements on device 10 may be configured by a user to implement a desired logic function on programmable logic device 10. For example, the state of a two-input multiplexer may be controlled by programming an associated FCE to output either a "0" or a "1." If the FCE supplies a "0," the first input of the multiplexer will be connected to its output. Programming the FCE so that the FCE supplies a "1," will direct the multiplexer to connect its second input to its output.

Figure 2:
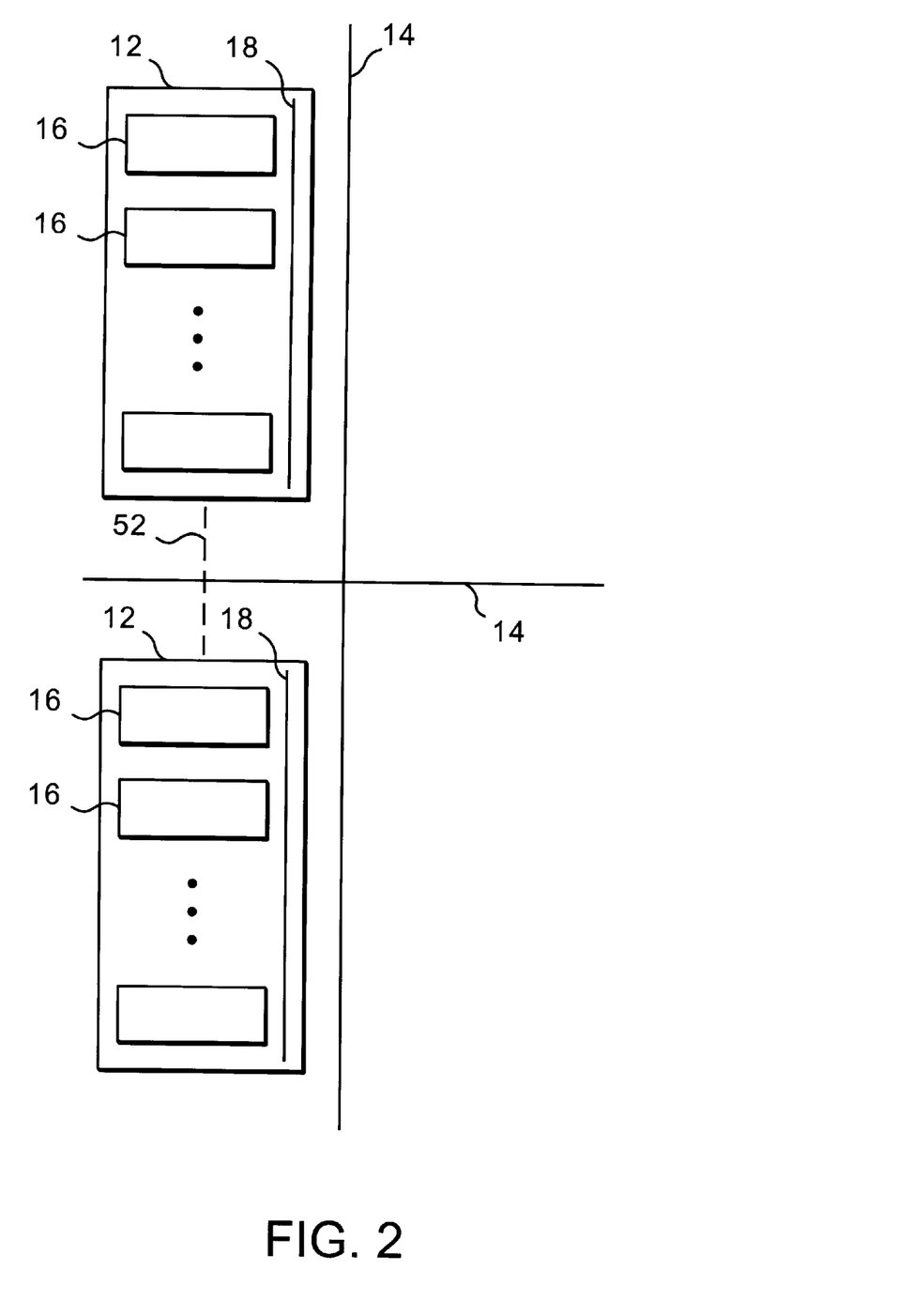
FIG. 2 is a schematic diagram that shows how regions of logic within the programmable logic device may contain subregions of logic and intra-region interconnection resources in accordance with the invention.

Some or all of regions 12 may be subdivided into a number of logic subregions 16, as shown in FIG. 2. As an example, each region 12 may have 10 subregions 16. This is merely an illustrative configuration. Regions 12 may have any suitable number of subregions 16 (e.g., 5–15) if desired.

Subregions 16 may be interconnected using the general interconnection resources of device 10 such as horizontal and vertical inter-region conductors 14. However, using such substantial conductors for short interconnections may be wasteful of resources and may not provide optimal performance. Accordingly, regions 12 may have associated shorter conductors such as conductors 18 of FIG. 2. Conductors 18 may be local or intra-region conductors that are used primarily or exclusively for routing signals between the subregions 16 within a single associated logic region 12. Conductors 18 may be continuous or segmented and, if segmented, may be programmably connected to serve as continuous conductors. Performance may be optimized and resources used most efficiently when signals that are to be shared among nearby logic subregions 16 are carried over only intra-region conductors 18 and few (if any) inter-region conductors 14.

Subregions 16 may contain look-up table logic. The size of the look-up tables that are used in subregions 16 may be selected by the manufacturer of programmable logic device 10 based on various performance trade-offs. For purposes of illustration, the present invention will be described primarily in the context of logic subregions 16 that are based on four-input look-up tables ("4-LUTs"). It will be appreciated, however, that this arrangement is merely illustrative. Look-up tables of any suitable size may be used if desired. For example, logic subregions 16 may be based on two-input look-up tables ("2-LUTs"), three-input look-up tables ("3-LUTs"), five-input look-up tables ("5-LUTs"), six-input look-up tables (6-LUTs), or any other suitable look-up table configurations.

Figure 3:
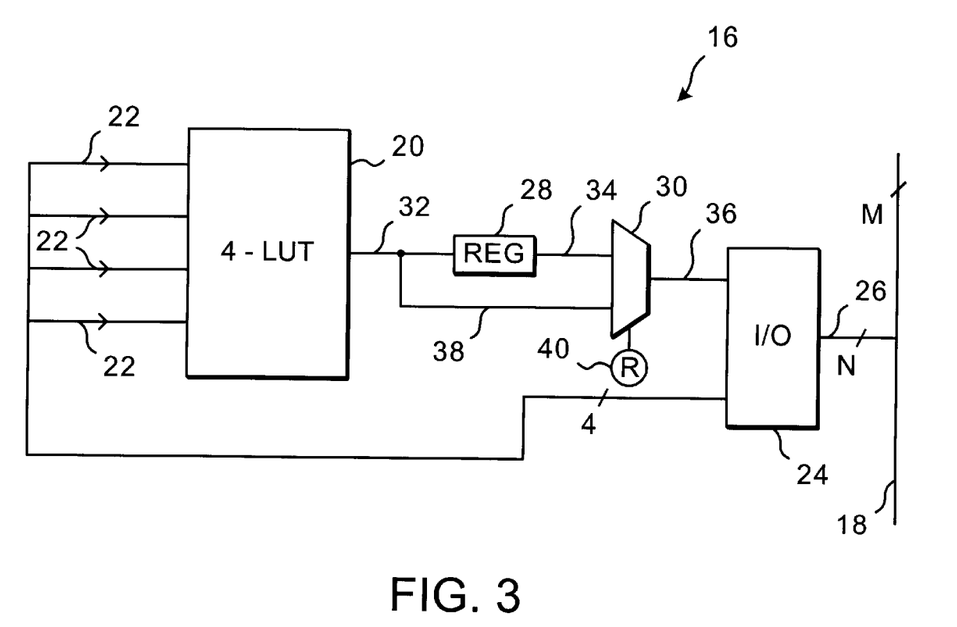
FIG. 3 is a schematic diagram of an illustrative logic subregion based on look-up table logic in accordance with the present invention.

An illustrative logic subregion 16 that is based on a four-input look-up table 20 is shown in FIG. 3. Four-input look-up table 20 may be programmed so that any desired logic function of its four inputs 22 is provided at its output 32.

The four inputs 22 of four-input look-up table 20 are connected to M intra-region conductors 18 by interface circuitry 24 and N branch conductors 26. In a typical device 10, there may be 20–30 (M) conductors 18 in each subregion 16 and 10–30 (N) conductors 26. This is, however, merely illustrative. Any suitable number of conductors 26 and 18 may be used if desired.

Interface circuitry 24 typically includes buffers, multiplexers, and tri-state drivers for providing output signals to conductors 18 and buffer and input multiplexer circuitry for providing input signals from conductors 18 to inputs 22. The connections that are made by the multiplexer circuitry in interface circuitry 24 and the circuitry of look-up table 20 may be programmed as needed to implement a desired logic design for programmable logic device 10.

Logic subregions 16 may contain optional register circuitry, as shown by illustrative register 28 of FIG. 3. When register logic is used, bypass circuitry may be used to selectively bypass the register logic when an unregistered output is desired. For example, with the arrangement of FIG. 3, function control element 40 may be used to program multiplexer 30 so that the output 32 of look-up table 20 is provided directly to interface circuitry 24 (by connecting bypass conductor 38 to multiplexer output 36) or so that output 32 of look-up table 20 is provided to interface circuitry 24 through register 28 (by connecting conductor 34 to multiplexer output 36).

Thus, with the subregion arrangement of FIG. 3, the output of look-up table 20 may be routed through an optional register and may directly provided to conductors 18 without passing through any additional look-up table logic.

The circuitry of FIG. 3 that lies between four-input look-up table 20 and conductors 18 has been described as being part of the subregion 16. If desired, some or all of such register and interface circuitry may be considered to be separate from subregion 16.

Figure 4:
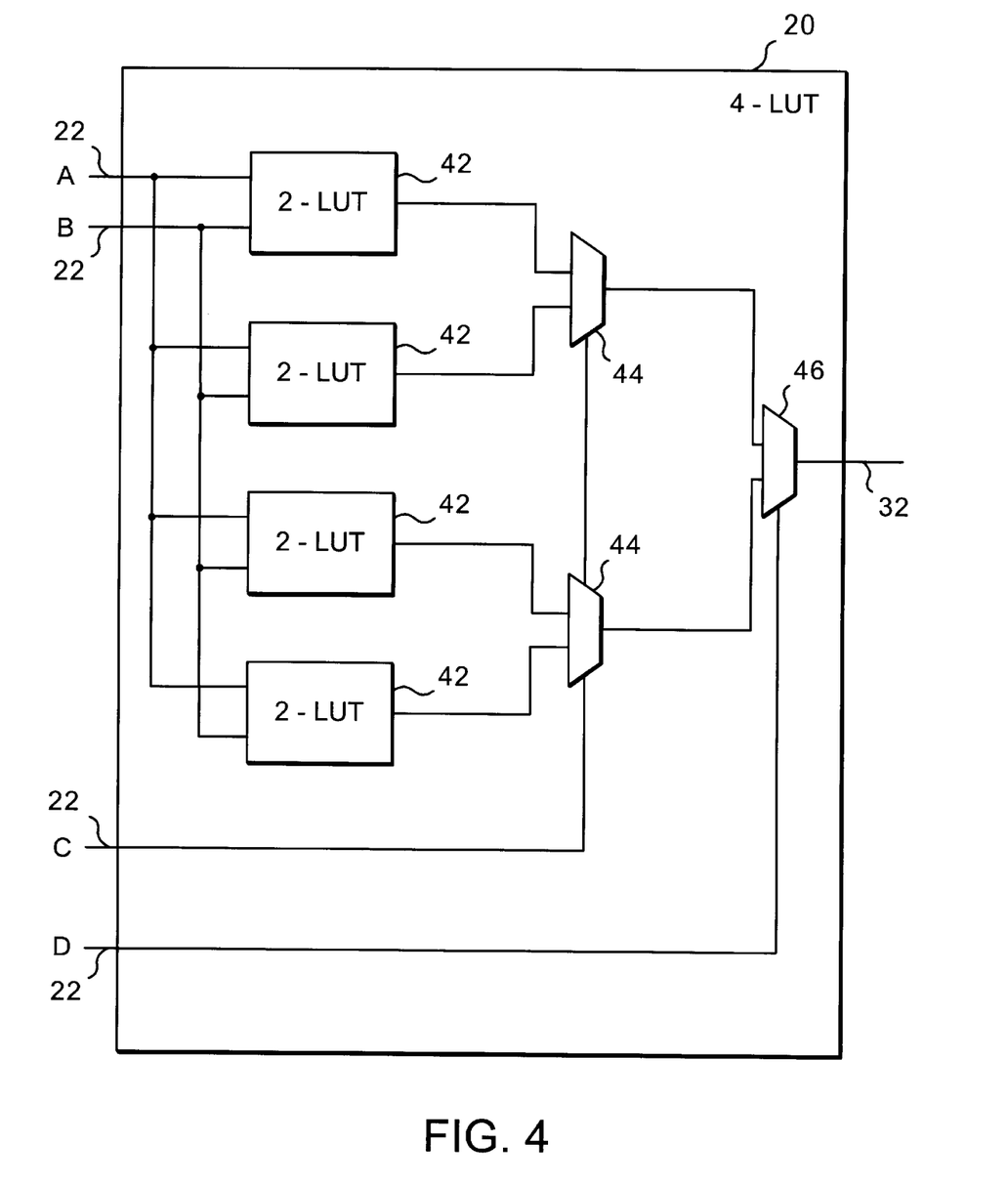
FIG. 4 is a schematic diagram showing how a four-input look-up table may be based on four two-input look-up tables in accordance with the present invention.

The functionality of four-input look-up table 20 may be provided using four two-input look-up tables 42, as shown in FIG. 4. The cells of two-input look-up tables 42 may be programmed with a desired bit pattern. With the arrangement of FIG. 4, one of the four-input look-up table inputs (input C in this example) may be used to control multiplexers 44. Multiplexers 44 are used to select which of the two-input look-up table outputs are passed to multiplexer 46. Another of the four-input look-up table inputs (input D in this example) may be used to control multiplexer 46. This configuration allows any logic function of inputs A, B, C, and D to be produced at output 32.

Figure 5:
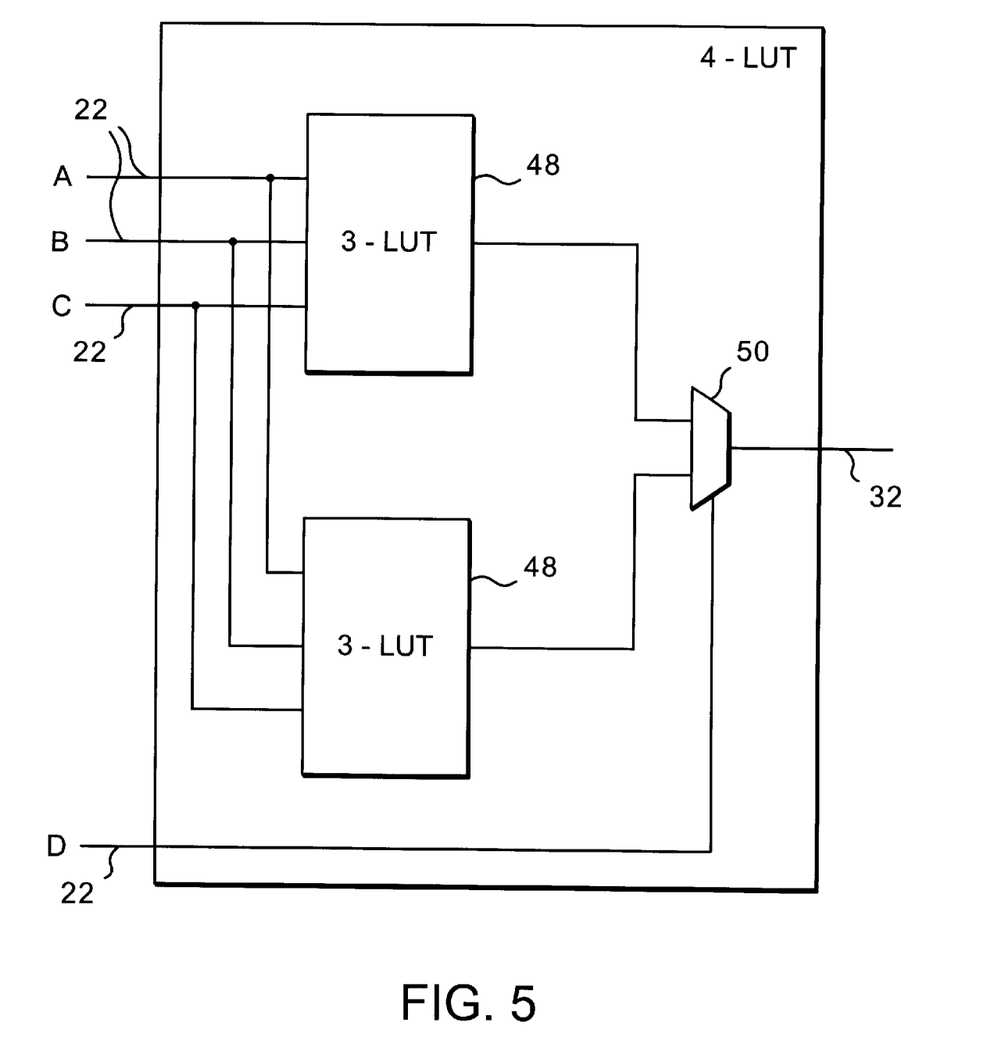
FIG. 5 is a schematic diagram showing how a four-input look-up table may be based on two three-input look-up tables in accordance with the present invention.

The functionality of four-input look-up table 20 may also be provided using two three-input look-up tables 48, as shown in FIG. 5. The cells of three-input look-up tables 48 may be programmed with a desired bit pattern. As shown in FIG. 5, one of the four-input look-up table inputs (input D in this example) may be used to control multiplexer 50. The state of multiplexer 50 may be used to select which of the outputs from three-input look-up tables 48 are to be passed to the four-input look-up table output 32.

The configurations of FIGS. 4 and 5 are merely illustrative. Any suitable circuitry for providing the functions of a four-input look-up table may be used in a four-input look-up table 20 if desired.

Figure 6:
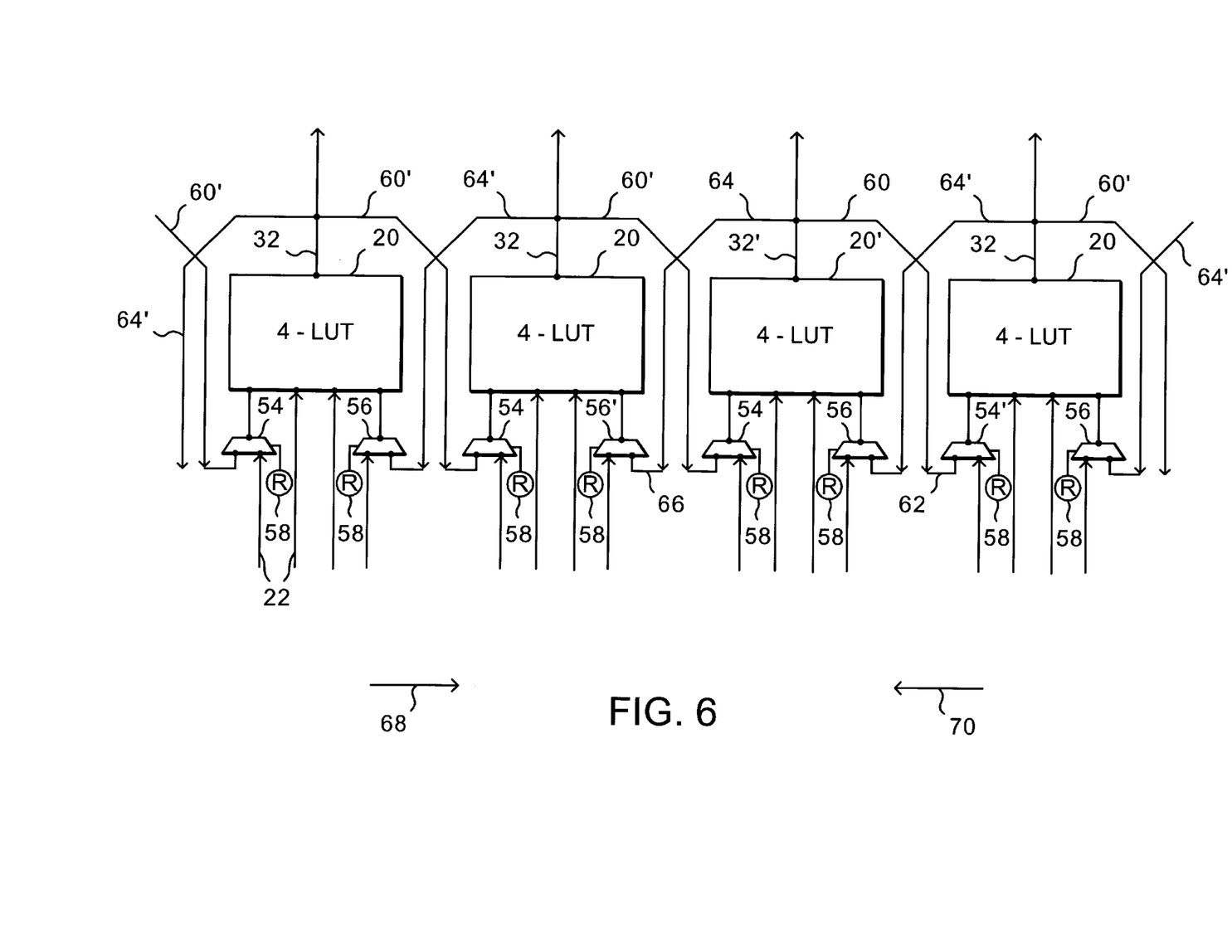
FIG. 6 is a schematic diagram showing a series of illustrative four-input look-up tables arranged in a line that have been provided with associated bidirectional programmable cascade connections in accordance with the present invention.

An illustrative arrangement where bidirectional cascade connections have been used to interconnect look-up tables 20 is shown in FIG. 6. In the example of FIG. 6, four look-up tables 20 are shown. It will be appreciated, however, that the cascade connection arrangement of FIG. 6 may be used for all look-up tables 20 and logic subregions 16 in a logic region 12 and for some or all logic regions 12. If desired, cascade connections may also be provided between the last look-up table 20 or logic region 16 of one logic region 12 and the first look-up table 20 or logic region 16 of another logic region 12. This region-to-region bidirectional cascade feature is shown by dotted line 52 in FIG. 2. Dotted line 52 of FIG. 2 represents two cascade conductors each of which carries cascade signals in the opposite direction between the two adjacent logic regions 12.

With the cascade connection arrangement of FIG. 6, each four-input look-up table 20 has two associated input multiplexers (PLCs) 54 and 56. Each multiplexer 54 and 56 has two associated inputs and an output. FCEs 58 may be used to program the multiplexers so that they direct certain desired inputs to their outputs. The output 32 of each look-up table 20 is generally connected to the inputs of two multiplexers. For example, the output 32' of look-up table 20' is connected by conductor 60 to input 62 of multiplexer 54' and is connected by conductor 64 to input 66 of multiplexer 56'. The output 32 of each look-up table is cascaded in this way in two directions. In one direction (shown by arrow 68), cascade signals may be carried from the output of each look-up table 20 to the inputs of the next look-up table in the line of look-up tables by cascade conductors 60 and 60'. In the other direction (shown by arrow 70), cascade signals may be carried from the output of each look-up table 20 to the input of the next look-up table in the line by cascade conductors 64 and 64'.

Conductors 60, 60', 64, and 64' are called "cascade" conductors because they pass the final output signals from look-up tables 20 to the normal logic inputs of other look-up tables 20. The cascade conductors are distinct from the interconnection resources such as intra-region conductors 18, interface circuitry 24, and inter-region conductors 14. It would therefore not be appropriate to refer to signals that had been routed all the way onto conductors 18 or other such interconnection resources as "cascade" signals. Such a routing path would introduce unacceptable delays of the type that the various cascade configurations are used to avoid.

Cascade conductors are also different from other conductors that may be provided on programmable logic device 10 such as those that route intermediate logic signals from the middle of look-up tables 20 to other logic on the device. For example, cascade conductors are different from the carry conductors used to route carry signals from the carry-out output of one look-up table to the carry-in input of another look-up table. Carry signals are signals that may be used in arithmetical operations such as addition, counting, and subtraction. Carry signals are routed directly from the carry-out output of a look-up table to the special hardwired carry-in input of an adjacent look-up table over a carry conductor. The carry-in input of a given k-input look-up table (k-LUT) is a dedicated additional (k+1) input to the k-LUT that is separate from the k ordinary logic inputs for that LUT. For example, the carry-in input of a 4-LUT is a dedicated $5^{th}$ input that is separate from the 4 regular inputs to that 4-LUT. In contrast, when used, a cascade input signal replaces one of the k ordinary logic input signals. For example, the cascade input signal that is provided to a 4-LUT (such as one of the 4-LUTs shown in the drawings) replaces one of the 4 ordinary logic input signals to that 4-LUT.

A cascade signal is a signal that has been produced at the output of a k-input look-up table logic in a subregion with k inputs (e.g., a signal that has been produced at the output of a four-input look-up table in the present example and not the smaller two-input or three-input look-up tables from which the four-input look-up table may be constructed) and that has been routed to one of the normal logic inputs of another look-up table. Typically, each of the look-up tables are of the same size (i.e., the look-up tables supplying cascade outputs and the look-up tables receiving cascade signals at their inputs all have the same number of inputs). This is, however, merely one illustrative arrangement. If desired, some of the look-up tables may be of different sizes.

The input connections at the inputs of look-up tables 20 are made using multiplexers 54 and 56. Each of multiplexers 54 and 56 may be programmed to connect either of their two inputs to their output. This allows the look-up tables 20 to be configured as either sequential linear cascade chains or cascade trees.

Figure 7:
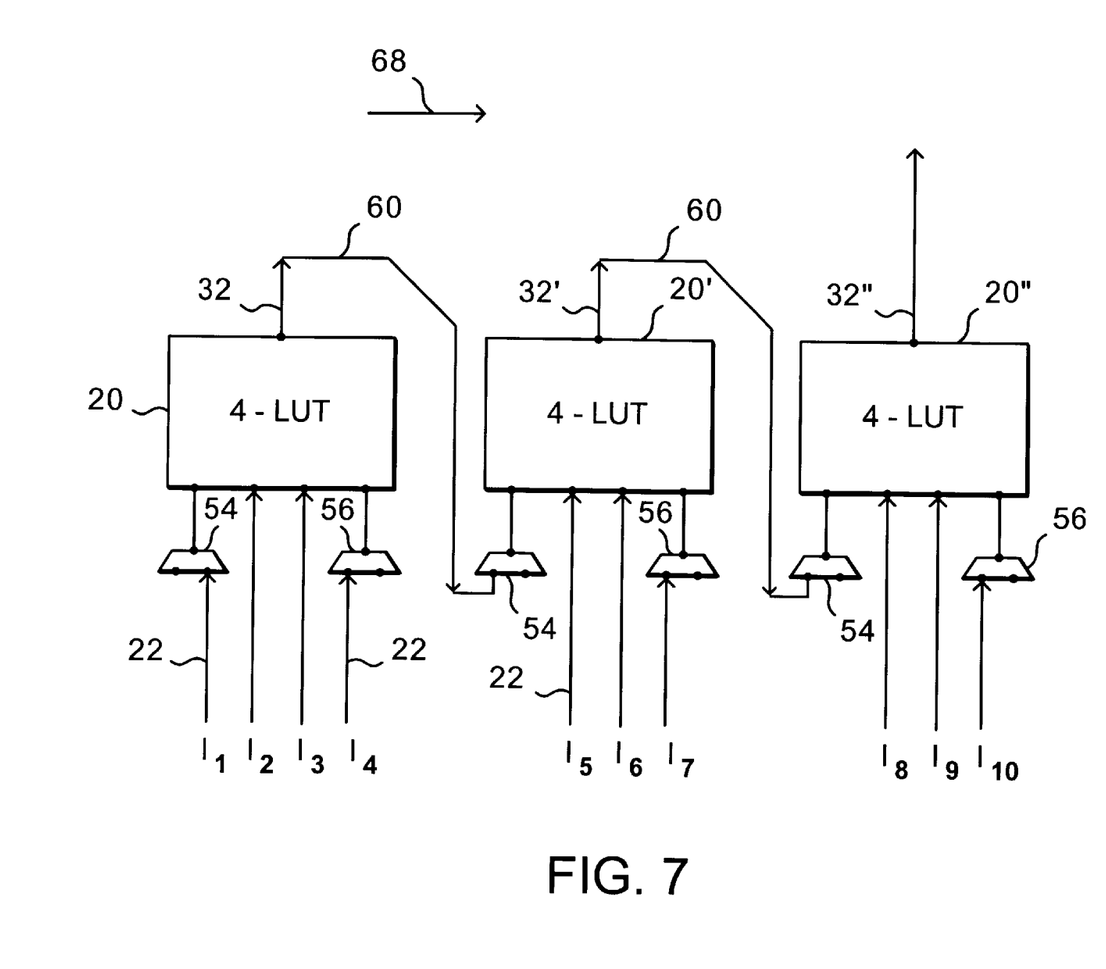
FIG. 7 is a schematic diagram showing how the logic of FIG. 6 may be programmed to form a unidirectional sequential linear cascade chain of look-up tables in accordance with the present invention.

The type of logic arrangement that results when look-up tables 20 are cascaded as a sequential linear chain is shown in FIG. 7. With the configuration of FIG. 7, multiplexers (PLCs) 54 and 56 have been configured to join look-up tables 20, 20', and 20" in a sequential chain. Cascade signals travel along cascade conductors 60 in direction 68. In the example of FIG. 7, three look-up tables have been cascaded in series. This is merely illustrative. Two or four, five, or more look-up tables may be cascaded in series if desired.

Each of look-up tables 20, 20' and 20" are programmed as needed to perform an overall logic function. Input signals $I_1$, $I_2$, $I_3$, $I_4$, $I_5$, $I_6$, $I_7$, $I_8$, $I_9$, and $I_{10}$ represent inputs to the look-up table chain. The output of the chained look-up tables is provided at output line 32". Output 32" may be connected to additional logic subregion circuitry such as the circuitry 28, 30, and 24 of FIG. 3. During operation, inputs $I_1$, $I_2$, $I_3$, and $I_4$ are logically combined according to the programmed function of look-up table 20. The output 32 is provided to an input of look-up table 20'. Inputs $I_5$, $I_6$, and $I_7$, of look-up table 20' serve as additional inputs to the chained logic. A suitable logic function may be programmed into the cells of look-up table 20' so that the inputs $I_5$, $I_6$, and $I_7$ may be used in combination with the output 32 that is applied to the first input line in look-up table 20'. Finally, the output 32' may be used in combination with signals applied to inputs $I_8$, $I_9$, and $I_{10}$ by programming a suitable logic function into look-up table 20".

Because there are 10 inputs $I_1$–$I_{10}$ and a single final output 32", the logic of FIG. 7 can perform some of the functions of a regular ten-input look-up table. It can also function as a nine-input or eight-input look-up table. Only two four-input look-up tables are typically cascaded when it is desired to perform the functions of seven-input, six-input, or five-input look-up tables. In all of these cascaded arrangements, it is not necessary to route output signals through the conductors 18 and the interface circuitry 24 and other such interconnection resources. By ensuring that the logic signals always pass directly from look-up table to look-up table over programmable cascade circuitry, these cascade arrangements avoid the delays that would otherwise be incurred by using intra-region conductors 18.

When implementing a given logic function using cascaded logic, it is sometimes necessary for the programmable logic device design software (e.g., the logic synthesis and place-and-route software) to consider the possibility of bridging multiple inputs and permuting (swapping) input assignments. For example, consider the situation in which a logic designer is attempting to implement an eight-input function using three four-input look-up tables that have been cascaded together to form a chain of the type shown in FIG. 7. The 8 inputs to a given logic design may be logic signals A, B, C, D, E, F, and G. One possible input assignment would be to assign logic signal A to input $I_1$, logic signal B to $I_2$, and so forth through logic signal G and input $I_8$. Inputs $I_9$ and $I_{10}$ may be left unused. This approach will be suitable for implementing a large number of possible eight-input functions.

However, some eight-input functions cannot be implemented when inputs $I_9$ and $I_{10}$ are left unused. To implement additional functions, the programmable logic device logic design software must also consider other possible arrangements. For example, the design software can consider the arrangement where input signal A is provided to both input $I_1$ and $I_9$. This input configuration may be implemented using the programmable routing resources on device 10. For example, the programmable circuitry in interface circuitry 24 (FIG. 3) may be used to form appropriate pathways to direct logic signal A to the appropriate look-up table inputs $I_1$ and $I_9$.

In general, any of the input signals A–G may be bridged across any two available inputs $I_1$–$I_{10}$. The design software may also consider arrangements where input signals are bridged across three input lines (e.g., where input signal C is applied to inputs $I_5$, $I_8$, and $I_{10}$). Still more logic functions can be implemented when the design software considers situations in which inputs to different look-up tables are permuted (e.g., when input signals A and G are assigned to inputs $I_1$ and $I_8$ or alternatively are assigned to $I_8$ and $I_1$). Permuting inputs (swapping inputs to one look-up table with those of another look-up table in the set of cascaded look-up tables) provides an additional degree of freedom when attempting to implement a desired logic design.

After considering all suitable configurations of used and unused inputs, bridged inputs and non-bridged inputs, and potentially permutated input assignments, the programmable logic device design software may be able to implement the desired logic function in the cascaded look-up tables.

A cascade chain of look-up tables is not completely identical in performance to a single larger look-up table with the same number of inputs. For example, there is a finite delay associated with passing the signals on inputs $I_1$, $I_2$, $I_3$, and $I_4$ through look-up table 20. This delay makes the timing of the cascade signal that is applied to the cascade input of look-up table 20' lag somewhat behind the signals applied to inputs $I_5$, $I_6$, and $I_7$. Similarly, look-up table 20' adds a non-zero delay, so the cascade input to look-up table 20" lags behind the signals on inputs $I_8$, $I_9$, and $I_{10}$. Because of the delays associated with passing signals through multiple look-up tables, the chained look-up table configurations are generally slower in operation than a dedicated larger look-up table. A logic design should therefore generally be implemented in such a way that critical paths pass through as few look-up tables as possible.

However, there are benefits to using smaller look-up tables (e.g., four-input look-up tables) as the basic building block elements for logic subregions 16, rather than much larger (e.g., ten-input) look-up tables. This is because large look-up tables consume rapidly-increasing shares of the available real-estate on device 10. This consideration can make very large look-up tables (e.g., regular ten-input look-up tables) unwieldy or impractical.

Moreover, four-input look-up tables generally exhibit better performance when handling four-input functions than larger look-up tables. Because not all designs require extensive use of look-up tables with a large number of inputs, using smaller look-up tables as the basis for subregions 16 avoids the performance penalties that would be introduced if users were only able to implement four-input designs using larger look-up tables.

Another consideration relates to the number of logic functions that can be implemented using a cascaded look-up table arrangement. A regular N-input look-up table can be used to implement any desired logic function of its N inputs. The same is not always true when multiple look-up tables are cascaded to produce an N-input cascaded arrangement. For example, only a fraction of the ten-input look-up table functions can be implemented using a cascaded four-input look-up table arrangement of the type shown in FIG. 7. This is true even though inputs may be bridged (i.e., the same logic signal may provided to two inputs at the same time), the inputs and output may be inverted by appropriate programming of the look-up table cells, and the order of the inputs may be permutated as needed to facilitate the implementation of a given design.

Despite this restriction, there is still a significant benefit to using cascaded look-up tables to implement the functions that can be implemented in this way. Those functions that cannot be implemented using the cascaded look-up table arrangement can be implemented by interconnecting the appropriate logic subregions 16 with the assistance of non-cascade routing resources such as conductors 18 (albeit with a performance penalty due to routing delays).

Figure 8:
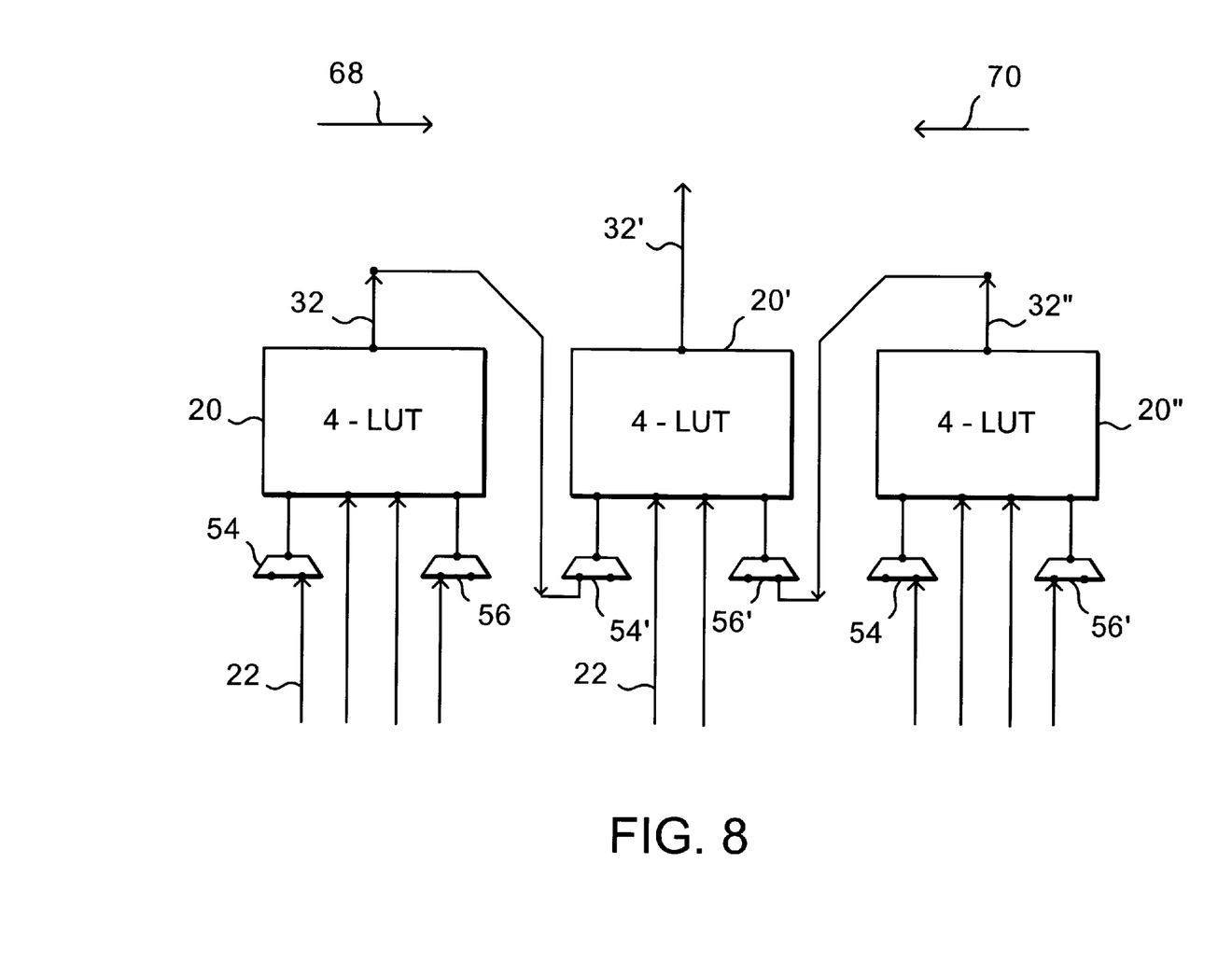
FIG. 8 is a schematic diagram showing how the logic of FIG. 6 may be programmed to form a two-level cascade tree of look-up tables in accordance with the present invention.

With the programmable bidirectional cascade arrangement of FIG. 6, additional logic functions can be implemented when needed by configuring the cascade connections to form a tree-type structure of the type shown in FIG. 8, rather than the sequential cascade chain of FIG. 7. The programmable logic device design software can thus consider whether to implement a given logic design provided by a logic designer using a chain configuration or a tree configuration. The programmable logic device design software can then select which configuration to use to provide desired results. The programmable logic device may then be programmed appropriately for use by an end-user.

Consider, as an illustration, a design that is impossible to implement using a three-look-up-table chain configuration. It may not be possible, for example, to implement a given nine-input logic function using the chain of FIG. 7. However, the programmable cascade circuitry of subregions 16 on device 10 may be programmed to form a look-up table cascade tree of the type shown in FIG. 8. With this arrangement it may be possible to implement the given nine-input logic function.

The two-level cascade tree approach of FIG. 8 can also avoid some of the delay associated with passing signals through multiple look-up tables. With the three-look-up-table two-level tree of FIG. 8, signals pass through at most two look-up tables. With the three look-up table cascade chain of FIG. 7, some signals pass through three look-up tables.

With the configuration of FIG. 8, multiplexers (PLCs) 54 and 56 have been configured to join look-up tables 20, 20', and 20" to form a two-level (signals pass through at most two look-up tables) cascade tree structure. The structure of FIG. 8 is a tree rather than a chain, because output signals are fed in parallel to the central look-up table from look-up tables on either side of the central look-up table.

In the example of FIG. 8, three look-up tables have been cascaded. This is merely illustrative. Any suitable number of look-up tables may be cascaded. For example, hybrid cascade structures can be formed that use both chain and tree components. A look-up table chain may be formed on either side of a central look-up table. With this type of chain-tree structure, two chains of (for example) three look-up tables each may be used to feed signals to a central look-up table (thereby forming a type of tree).

In the structure of FIG. 8, the output 32 from look-up table 20 has been directed to one of the inputs of central look-up table 20' using multiplexer 54'. The output 32" from look-up table 20" has been directed to one of the inputs of central look-up table 20' using multiplexer 56'. These cascade connections allow look-up tables 20, 20', and 20" to be programmed to perform desired logic functions using the 10 inputs $I_1$–$I_{10}$. The resulting final output signal from the cascaded logic of FIG. 8 is provided at output 32'.

The ten-input cascaded look-up table tree of FIG. 8 allows additional ten-input functions to be implemented beyond those that may be implemented using the ten-input unidirectional cascade chain of FIG. 7. Additional functions can also be provided even when the look-up table cascade of FIG. 8 is used to implement functions with fewer inputs such as nine-input functions, eight-input functions, seven-input functions, etc. As a result, programmable logic device 10 can use the bidirectional cascade capabilities of subregions 16 to implement more cascade logic functions than would otherwise be possible.

Because the arrangement of FIG. 8 allows ten-input, nine-input, and eight-input functions to be supported while only requiring that each of these inputs pass through two look-up tables instead of three (as required when the logic is configured as shown in FIG. 7), the performance penalties due to the delays associated with using multiple cascaded look-up tables may be minimized.

With the bidirectional cascade arrangement of FIG. 6 (and FIGS. 7 and 8), each of the look-up tables is the same size. Using identical look-up tables (i.e., look-up tables all having the same number of inputs and a single output) tends to reduce the computational burden imposed on the programmable logic device design software when attempting to implement desired logic functions. If desired, however, some of the look-up tables may have different sizes. Cascade chains and trees and hybrid structures may still be selectively formed using such differently-sized look-up tables following the approach described above in connection with FIGS. 6–9.

The programmable logic connector arrangements for interconnecting the cascade conductors to the inputs of the look-up tables such as the two-input multiplexers 54 and 56 are merely illustrative. Any suitable single multiplexer or group of multiplexers each having any suitable number of inputs or any other suitable programmable logic connector arrangement may be used to selectively route cascade signals on cascade conductors to the inputs of the look-up tables if desired. Such cascade routing arrangements may involve the use of programmable logic connectors that have shared duties and are therefore sometimes used for routing other signals to the look-up table inputs or other logic in device 10.

Moreover, although the programmable cascade circuitry described above provides significant flexibility when configuring device 10 for operation, there is a non-zero penalty associated with passing signals through programmable logic connectors such as multiplexers 54 and 56. Accordingly, it may be desirable to replace some or all of the programmable cascade circuitry with hardwired circuitry. For example, some or all of multiplexers 54 and 56 may be replaced with dedicated cascade conductors on all or a portion of programmable logic device 10.

Figure 9:
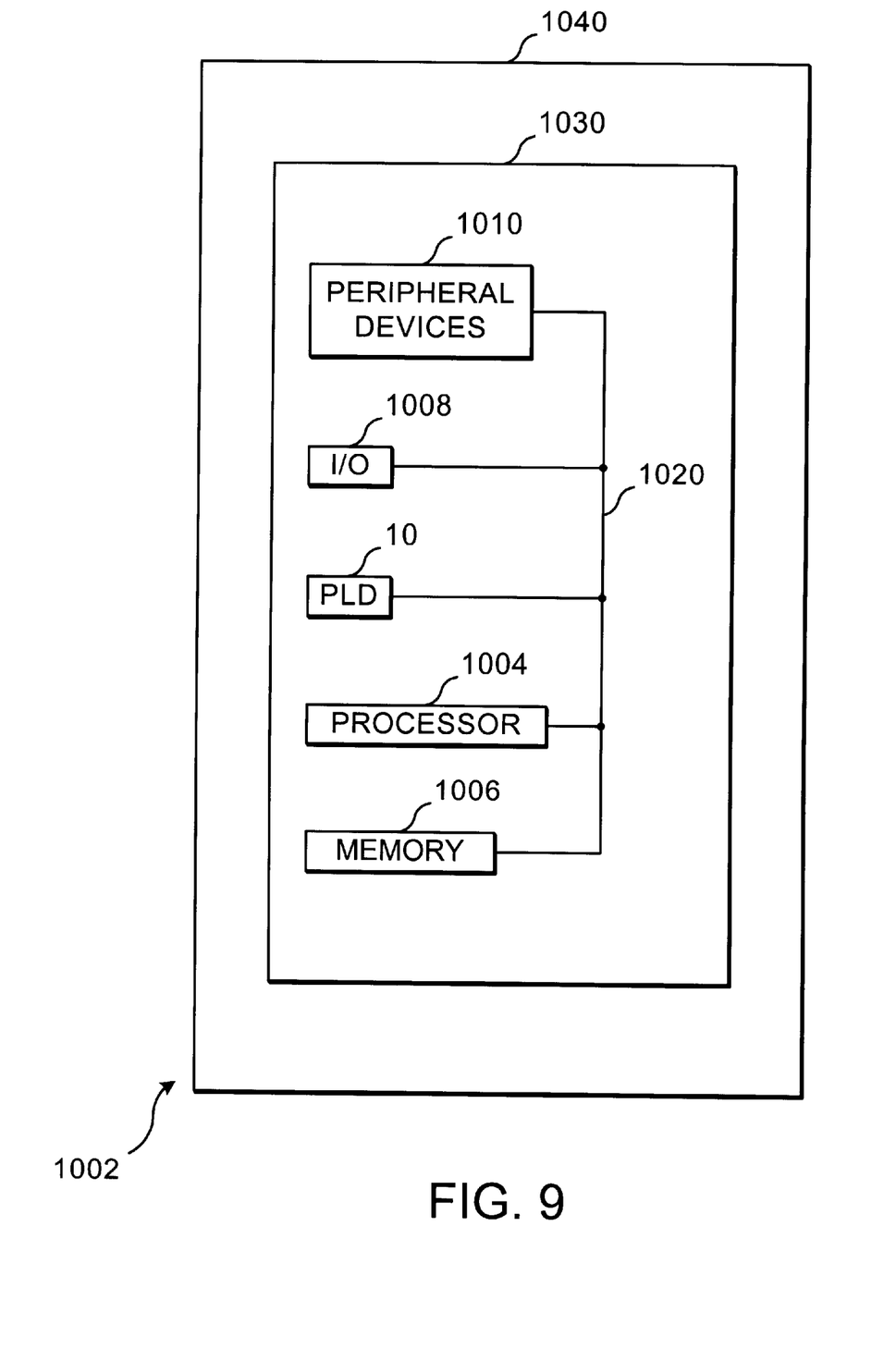
FIG. 9 is a simplified block diagram of an illustrative system employing a programmable logic device in accordance with the invention.

FIG. 9 illustrates a programmable logic device 10 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1004. Programmable logic device 10 may also be used as an arbiter for arbitrating access to a shared resource in system 1002. In yet another example, programmable logic device 10 can be configured as an interface between processor 1004 and one of the other components in system 1002. It should be noted that system 1002 is only exemplary, and that the true scope and spirit of the invention should be indicated by the following claims.

Various technologies can be used to implement programmable logic devices 10 having the features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the forgoing is only illustrative of the principles of the invention, and that various modifications can be made by those skilled in the art without departing from the scope and spirit of the invention. For example, the numbers of the various types of resources on device 10 can be different from the numbers present in the depicted and described illustrative embodiments. This applies to such parameters as the numbers of rows and columns of the various types of circuitry, the number of regions 12 and subregions 16, the numbers of the various types of interconnection conductors, the numbers and sizes of the PLCs provided for making interconnections between various types of interconnection conductors, etc. It will also be understood that various directional and orientational terms such as "vertical" and "horizontal," "left" and "right," "above" and "below," "row" and "column," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Terms like "region" and "subregion" are also used only as generic, relative terms, and other terms may be used for generally similar circuitry. Indeed, these terms may be used interchangeably herein in contexts in which a region/subregion hierarchy is not important. Alternatively, devices within the scope of this invention may have regions of programmable logic that are not divided into subregions. Although look-up table logic is employed in the illustrative embodiments shown and described herein, it will be understood that other types of logic may sometimes be used instead if desired. For example, sum-of-products logic, such as is the primary example considered in references like Pederson et al. U.S. Pat. No. 5,241,224 and Patel et al. U.S. Pat. No. 5,371,422 (both of which are hereby incorporated by reference herein in their entireties), may sometimes be used instead of look-up table logic. Although illustrated herein in the context of a particular programmable logic device architecture, it will be understood that various aspects of the invention are equally applicable to other programmable logic device architectures such as the various architectures shown in Freeman U.S. Pat. No. Re. 34,363, Cliff et al. U.S. Pat. No. 5,689,195, and Jefferson et al. U.S. patent application Ser. No. 09/266,235, filed Mar. 10, 1999, all of which are hereby incorporated by reference herein in their entireties.

The invention claimed is:

1. Programmable logic device circuitry comprising:
   a plurality of look-up tables each having a plurality of look-up table inputs and a corresponding look-up table output; and
   programmable cascade circuitry that may be programmed to connect the output of each look-up table directly to the inputs of two different look-up tables.

2. The programmable logic device circuitry defined in claim 1 wherein each of the look-up tables has the same number of inputs.

3. The programmable logic device circuitry defined in claim 1 further comprising:
   a plurality of logic regions;
   a plurality of inter-region conductors that are used to interconnect the logic regions;
   a plurality of logic subregions within each of the logic regions, wherein each logic subregion contains a single one of the look-up tables; and
   a plurality of intra-region conductors in each logic region that are used to interconnect the logic subregions in that logic region, wherein the programmable cascade circuitry may be programmed to connect the output of each look-up table to the inputs of the two different look-up tables without using any of the intra-region conductors.

4. The programmable logic device circuitry defined in claim 1 wherein the look-up tables are arranged in a line and wherein the programmable cascade circuitry includes some cascade conductors that route signals in one direction along the look-up tables in the line and other cascade conductors that route signals in an opposite direction along the look-up tables in the line.

5. The programmable logic device circuitry defined in claim 1 wherein the programmable cascade circuitry includes two programmable multiplexers associated with each given look-up table, wherein each of the two multiplexers has two inputs and an output, wherein a first of the two inputs of each multiplexer is directly connected to the output of a look-up table that is adjacent to that given look-up table and a second of the two inputs of each multiplexer is used to receive a logic signal input, wherein the multiplexers may each be configured to connect either the first or the second of the two multiplexer inputs to its multiplexer output, and wherein the multiplexer output of each multiplexer is connected to one of the look-up table inputs associated with that given look-up table.

6. The programmable logic device circuitry defined in claim 1 wherein the cascade circuitry may be programmed to connect some of the look-up tables as either a sequential cascade chain or as a cascade tree.

7. The programmable logic device circuitry defined in claim 1 wherein the cascade circuitry may be programmed to connect three of the look-up tables to form a three-look-up-table sequential cascade chain or may be programmed to connect those three of the look-up tables to form a three-look-up-table two-level cascade tree.

8. The programmable logic device circuitry defined in claim 1 wherein the look-up tables each have only four inputs.

9. The programmable logic device circuitry defined in claim 1 further comprising a register at the output of each look-up table.

10. The programmable logic device circuitry defined in claim 1 further comprising programmable interconnection conductors and circuitry configured to route the output signals of the look-up tables to the look-up table inputs, wherein the cascade connection circuitry is distinct from the programmable interconnection conductors and circuitry.

11. Circuitry comprising:
    at least first, second, and third look-up tables each having an identical number of look-up table inputs and each having a corresponding look-up table output; and
    at least first, second, and third cascade conductors; and
    programmable logic connectors at the inputs of at least the second and third look-up tables, wherein the programmable logic connectors may be programmed so that (1) the look-up tables form a sequential cascade chain in which the first cascade conductor passes output signals directly from the first look-up table output to one of the inputs of the second look-up table, and the second cascade conductor passes output signals directly from the second look-up table output to one of the inputs of the third look-up table or (2) the look-up tables form a cascade tree in which the first cascade conductor passes output signals directly from the first look-up table output to one of the inputs of the second look-up table and the third cascade conductor passes output signals directly from the third look-up table output to one of the inputs of the second look-up table.

12. The circuitry defined in claim 11 further comprising a plurality of regions and subregions of programmable logic, wherein the plurality of regions and subregions of logic are arranged on an integrated circuit in rows and columns, and wherein each of the look-up tables is associated with a different one of the subregions of programmable logic.

13. A method for programming programmable logic device circuitry to implement a given logic function in look-up table logic, wherein the programmable logic device circuitry has a plurality of look-up tables each having a plurality of look-up table inputs and a corresponding look-up table output and programmable cascade circuitry, comprising:

selecting a desired look-up table configuration in which the programmable cascade circuitry is to (1) directly connect some of the look-up table outputs to some of the look-up table inputs to form a sequential cascade chain of the look-up tables or (2) directly connect some of the look-up table outputs to some of the look-up table inputs to form a cascade tree of the look-up tables; and programming the programmable cascade circuitry to form the desired look-up table configuration.

14. The method defined in claim 13 wherein each of the look-up tables is identical.

15. The method defined in claim 13 wherein the look-up tables each have only four look-up table inputs.

16. The method defined in claim 13 wherein the look-up tables are arranged in a line within corresponding subregions of programmable logic and wherein each subregion has a register, the method further comprising programming the subregions to selectively bypass at least some of the registers.

* * * * *